(12) United States Patent
Figura et al.

(10) Patent No.: US 9,959,734 B1
(45) Date of Patent: May 1, 2018

(54) PREDICTIVE SHOCK ALERT WARNING SYSTEM FOR USE IN BODIES OF WATER

(71) Applicants: John Figura, Lake Ozark, MO (US); David Hotz, Lake Ozark, MO (US)

(72) Inventors: John Figura, Lake Ozark, MO (US); David Hotz, Lake Ozark, MO (US)

( * ) Notice: Subject to any disclaimer, the term of this patent is extended or adjusted under 35 U.S.C. 154(b) by 0 days. days.

(21) Appl. No.: 15/495,346

(22) Filed: Apr. 24, 2017

(51) Int. Cl.
| | |
|---|---|
| G08C 19/22 | (2006.01) |
| G08B 21/08 | (2006.01) |
| G08B 7/06 | (2006.01) |
| H04Q 9/00 | (2006.01) |
| G01R 19/165 | (2006.01) |
| H02J 9/06 | (2006.01) |

(52) U.S. Cl.
CPC ......... G08B 21/082 (2013.01); G01R 19/165 (2013.01); G08B 7/06 (2013.01); H02J 9/061 (2013.01); H04Q 9/00 (2013.01)

(58) Field of Classification Search
CPC ........ G08B 21/082; G08B 7/06; G08B 21/08; G01R 19/165; G01R 19/00; G01R 19/0084; G01R 19/155; G01R 19/1659; H02J 9/061; H04Q 9/00
See application file for complete search history.

(56) References Cited

U.S. PATENT DOCUMENTS

| | | | |
|---|---|---|---|
| 3,510,766 A | 5/1970 | Russell et al. | |
| 3,774,110 A | 11/1973 | Roveti | |
| 3,784,903 A | 1/1974 | Thomas | |
| 3,869,668 A | 3/1975 | Thompson | |
| 5,005,007 A | 4/1991 | Weng et al. | |
| 5,402,298 A | 3/1995 | Gershen et al. | |
| 8,643,360 B1 | 2/2014 | Cargill, III | |
| 8,686,713 B2 | 4/2014 | Cargill, III | |
| 9,285,396 B2 | 3/2016 | King, Jr. et al. | |
| 2011/0277488 A1 | 11/2011 | Peretz | |
| 2014/0111332 A1* | 4/2014 | Przybylko | G06Q 10/00 340/539.1 |

(Continued)

FOREIGN PATENT DOCUMENTS

WO 2010078617 A1 7/2010

OTHER PUBLICATIONS boatzincs.com, Inc., "Corrosion Reference Electrode and User's Guide by ABYC—Certified Corrosion Experts" website, Sep. 18, 2010, 1 page.

(Continued)

Primary Examiner — Ryan Sherwin
(74) Attorney, Agent, or Firm — Sandberg Phoenix

(57) ABSTRACT

A predictive shock alert warning system (SA) installed adjacent a body of water and monitoring a voltage level present in the water to alert persons in or about the water the water when the level is approaching, or reaches or exceeds a threshold that will produce a dangerous shock to a person. The system comprises a plurality of probes (1-3) placed in the water, each probe monitoring the voltage level in a zone (Z1-Z3) of water surrounding the probe and producing an output representing the voltage level for the respective zone in which the sensor is placed. An apparatus (100) processes the respective signals from each probe and triggers an alarm (13) when a voltage approaches, reaches or exceeds the danger voltage level.

29 Claims, 4 Drawing Sheets

(56) References Cited

U.S. PATENT DOCUMENTS

| | | | |
|---|---|---|---|
| 2014/0125346 A1* | 5/2014 | Barfield | G01R 19/00 |
| | | | 324/426 |
| 2015/0198548 A1 | 7/2015 | Fournier et al. | |
| 2016/0154036 A1 | 6/2016 | King, Jr. et al. | |
| 2016/0299178 A1 | 10/2016 | King, Jr. et al. | |
| 2017/0109994 A1* | 4/2017 | King, Jr. | G08B 21/082 |

OTHER PUBLICATIONS

Reef Central, LLC, "Can a Standard Multimeter Measure Voltage in Water?" forum webpage, Feb. 22, 2017, 4 pages, Jelsoft Enterprises Ltd.

United States Department of Agriculture ("USDA"), "Effects of Electrical Voltage/Current on Farm Animals: How to Detect and Remedy Problems," Dec. 1991, 151 pages, Agriculture Handbook No. 696, Lefcourt, A.M.

Johnson, Donald R., P.E., "The Case of Stray Voltage in a Lake" webpage, Nov. 1, 2009, 4 pages, Penton.

Electric Power Research Institute, Inc. ("EPRI"), "Elevated Neutral-to-Earth Voltage, Contact Voltage, and Other Perceptability Concerns for Humans and Animals" webpage, Feb. 22, 2017, 20 pages.

Fluke Corporation, "Testing Corrosion Protection Systems" Application Note, 1998, 2 pages.

Sam's Marine, "How Do You Measure Stray Current in the Water?" forum, Feb. 11, 2010, 2 pages.

electriciantalk.com, "Measuring Pool Water Voltage" forum, Feb. 22, 2017, 12 pages, vBulletin Solutions, Inc.

Page, Marty L., P.E., "Stray and Contact Voltage at Swimming Pools" presentation, Jun. 17, 2010, 30 pages, Southern Company and Georgia Power Company.

boatzincs.com, Inc., "Corrosion Reference Electrode" webpage, Jul. 23, 2008, 1 page.

Cargill, III, George Slade, U.S. Appl. No. 61/696,204, filed Sep. 2, 2012, 10 pages.

boatzincs.com, Inc., "Corrosion Reference Electrode and User's Guide by ABYC-Certified Corrosion Experts" webpage, Feb. 22, 2017, 1 page.

Dock Lifeguard, LLC, "Dock Warning System for Electrical Current Detection in the Water" brochure, 2012, 2 pages.

Electric Power Research Institute (EPRI), Inc., "Pool Shocking—"Fun in the Sun" Can Be a Shocking Event" Technical Brief article, Jun. 2000, 8 pages.

* cited by examiner

PREDICTIVE SHOCK ALERT WARNING SYSTEM FOR USE IN BODIES OF WATER

BACKGROUND OF THE INVENTION

This invention relates to a predictive shock alert warning system comprising sensor probes and an apparatus installed in or near a body of water such as a swimming pool, a river, or a lake. The sensors are placed in the body of water and the apparatus on, or adjacent to, the pool, a swimming dock, or a boat dock in a marina or the like. The system provides an audible and visual alarm when a sensed electrical voltage in the water is of a level approaching that which can seriously shock or electrocute people who may be in the water or about to enter the water.

It is well-known by those living on or near lakes, rivers, and other bodies of water, that a voltage associated with electrical currents or electrical gradients present in a pool or in the water near a shore, a dock, or a boat, etc., can, on occasion, rise to a level by which someone in the water and exposed to the voltage, can be seriously injured or electrocuted. Sadly, there are numerous recorded instances where people, particularly children, have died or been severely shocked when they inadvertently were exposed to a voltage which exceeded the threshold for causing injury or death. The cause of these electrical shock drowning (or ESD) conditions vary widely depending upon a number of factors with a faulty electrical ground or faulty electrical equipment being but two such conditions which can result in a current or voltage gradient near the shore, dock, or boat. Other factors include condition of the water (i.e., its salinity, temperature, if the water is clear or murky, etc.) as well as a person's body weight. Importantly, there is usually no visual indication that water in a swimming pool or in the proximity of a swimming dock, or a boat dock is electrified.

In the July, 2013 edition of Seaworthy magazine, in an article titled: ESD Explained, the author described (at page 7 of the periodical) that ESD arises from three conditions which are a) an electrical fault in which electricity is escaping from somewhere in an electrical system and is trying to find a path back to its source; b) an AC safety ground fault is present by which the AC grounding system has somehow been compromised so stray current cannot return to electrical ground through a ground safety wire; and c) there is no ground fault safety protection. The article goes on to warn about swimming within 100 yards of a marina, boat yard or any dock using electrical power. However, as noted above, despite such possible warnings, people do swim in these areas.

What level of voltage can be dangerous to someone in contact with the water? In the open access journal eplasty (www.eplasty.com) article Conduction of Electrical Current to and Through the Human Body: A Review, by Dr. Raymond Fish, a person stood in buckets filled with fresh water to a level near the person's hip. Testing indicated that with a voltage of 3.05V applied between the plates, there was an involuntary flexion of the person's knees to 90° and this flexion could not be overcome by voluntary effort of the person. With an application of 4.05V, the knee involuntarily flexed to 135°, bringing the person's foot up to near their buttock; and, again this flexion could not be overcome by voluntary effort of the person. It will be appreciated by those skilled in the art that, at a minimum, these situations could greatly affect a person's ability to swim toward a shore or a dock ladder in order to get themselves out of the water.

Also, while obviously not being tested on persons, increasing voltage levels above these values will produce an ESD condition.

Because of the notoriety surrounding ESD incidents, particularly fatal ones, when they occur, the applicants are aware of someone, as early as 2007-09, developing and installing a sensor system for detecting voltage levels which can injure or kill someone, and sound a visual and/or audio alarm to warn people near or in the water that a dangerous condition exists. The system was installed on boat docks in Central Missouri and is still in operation.

Also, as early as 1990, the United States Department of Agriculture in a handbook on Effects of Electrical Voltage/Current on Farm Animals: How To Detect and Remedy Problems addressed similar safety concerns regarding farm livestock and presented a testing apparatus for sensing dangerous voltage levels in water on farms from which animals drank or bathed. In addition, a number of U.S. patents and published applications address similar safety considerations with respect to swimming pools, large bodies of water such as lakes, as well as safety around oceanic oil drilling platforms. The patents include the following: U.S. Pat. Nos. 3,510,766; 3,784,903; 3,869,668; 5,005,007; 8,686,713; and 9,285,396. The published applications include: 2015/0198548, 2016/0154036, and 2016/0299178.

While these previous systems or devices may work well for their intended purpose, they do have drawbacks. Most importantly, as pointed out by the Electrical Shock Drowning Prevention Association (ESDPA) in their position statement of June, 2016 on "Green Light Devices", prior art detectors create a "false sense" of security in that they are reactive devices, not predictive devices. That is, they only indicate that a dangerous condition exists, not that there is an impending danger of such a condition.

In addition, existing sensors or detectors have a limited operating range. Accordingly, a threat condition may exist which could go undetected if it exists outside the current operating range of sensors. In addition, if a system employs multiple sensors, unless the sensors are isolated from one another, it may be difficult to determine the extent of a danger zone because of overlapping areas or zones of water monitored by the sensors. Further, current sensors or detectors are prone to providing false readings. These can be caused by, for example, ground loops resulting from using the earth as an electrical conductor, plastic floats that act as a capacitor whereby a varying voltage level is produced due to wave action, noise created by boat propellers, and radio frequency (rf) interference due to radio transmission equipment found on boats or docks, faulty electric motors, etc.

In many recreational areas surrounding a lake or other body of water, it is commonplace to find a large number of individual docks used by recreational home owners and their guests; and it is also commonplace for people, particularly children to swim or wade in the water around such docks. Further found in these areas are multi-slip docks maintained by hotels, boat rental facilities, etc. Each such site represents a separate location for potential danger given the large amount of electrical equipment (lighting, audio systems, winches, etc.) located on or near these installations.

One issue for owners of these properties is insurance. A reliable shock detection system, properly installed and in compliance with local ordinances helps keep insurance premiums down for owners of these properties because such an installed system assures a safe environment for swimmers, boaters, etc.

Accordingly, there is a need for a simple, efficient shock alert warning system using reliable sensors and associated apparatus which accurately detect voltage levels approaching, reaching, or exceeding a danger threshold and which automatically alarm people in the vicinity of a danger area, as well as those having oversight of the area. Doing so can provide additional assurance the safety of those otherwise in danger as well as alerts those responsible for the site of the need to find the cause of the problem producing the dangerous condition and fixing it.

BRIEF SUMMARY OF THE INVENTION

The present disclosure is directed to a shock alert warning system including a plurality of sensor probes and associated apparatus for detecting and providing an indication of voltage levels in the water, and sensed by one or more of the sensor probes, that are approaching and may subsequently exceed a danger threshold and can cause serious injury or death to a person in or near the water or about to enter the water. The voltage levels associated with these thresholds are with regard to the voltage levels noted in the above referenced article in the Background section of this application. Since the system provides an indication and an alarm, including a verbal alarm, of the approach of a dangerous condition, it provides a predictive capability regarding such conditions.

The sensor probes are each located in a different zonal area of water at the monitored site so to enhance coverage by the system. The probes are electrically isolated from each other and operate independently of each other so to enhance the apparatus' ability to reliably monitor each zone. The apparatus and probes are readily installed and positioned about a boat dock or swimming pool or platform, as well as multi-slip boat docking facilities.

The apparatus and probes are designed for safe and reliable operation and, when the system is installed by a competent electrician in accordance with the system's guidelines, will comply with local ordinances relating to them. Signals transmitted from the probes are processed to eliminate false readings which can arise from a number of factors. Further, when the input from a particular probe indicates a potential dangerous condition, the apparatus is programmed to focus on inputs from that probe to ascertain the severity of that condition, while still monitoring inputs from each of the other probes.

The apparatus constantly monitors the sensed voltage output of each probe and if a signal is detected from a probe indicating the voltage level within a certain zone is approaching, has reached, or exceeds a predetermined threshold of danger, the apparatus "locks" onto that zone, displays the level of detected voltage for that zone and provides an alarm warning of danger with regard to that zone.

The alarm provided by the apparatus is both audio (including a verbal alarm) and visual and is provided both at the dock site as well as in other areas. These include a house, hotel, or boat facility located in proximity to the dock, as well as a fire or police station or the location of other first responders. In a multi-slip facility, for example, audio and visual alarm indicators are placed at spaced locations along the dock adjacent each slip.

The system operates on AC power, with a battery backup, and its components are housed in a weather resistant enclosure. If the apparatus is installed on a dock, it detects both if the dock is electrified as well as if the water surrounding the dock is electrified.

Other objects and features will be in part apparent and in part pointed out hereinafter.

BRIEF DESCRIPTION OF THE SEVERAL VIEWS OF THE DRAWINGS

The accompanying figures, together with detailed description which follows, form part of the specification and illustrate the various embodiments described in the specification.

Corresponding reference characters indicate corresponding parts throughout the several views of the drawings.

DETAILED DESCRIPTION OF INVENTION

Figure 1:
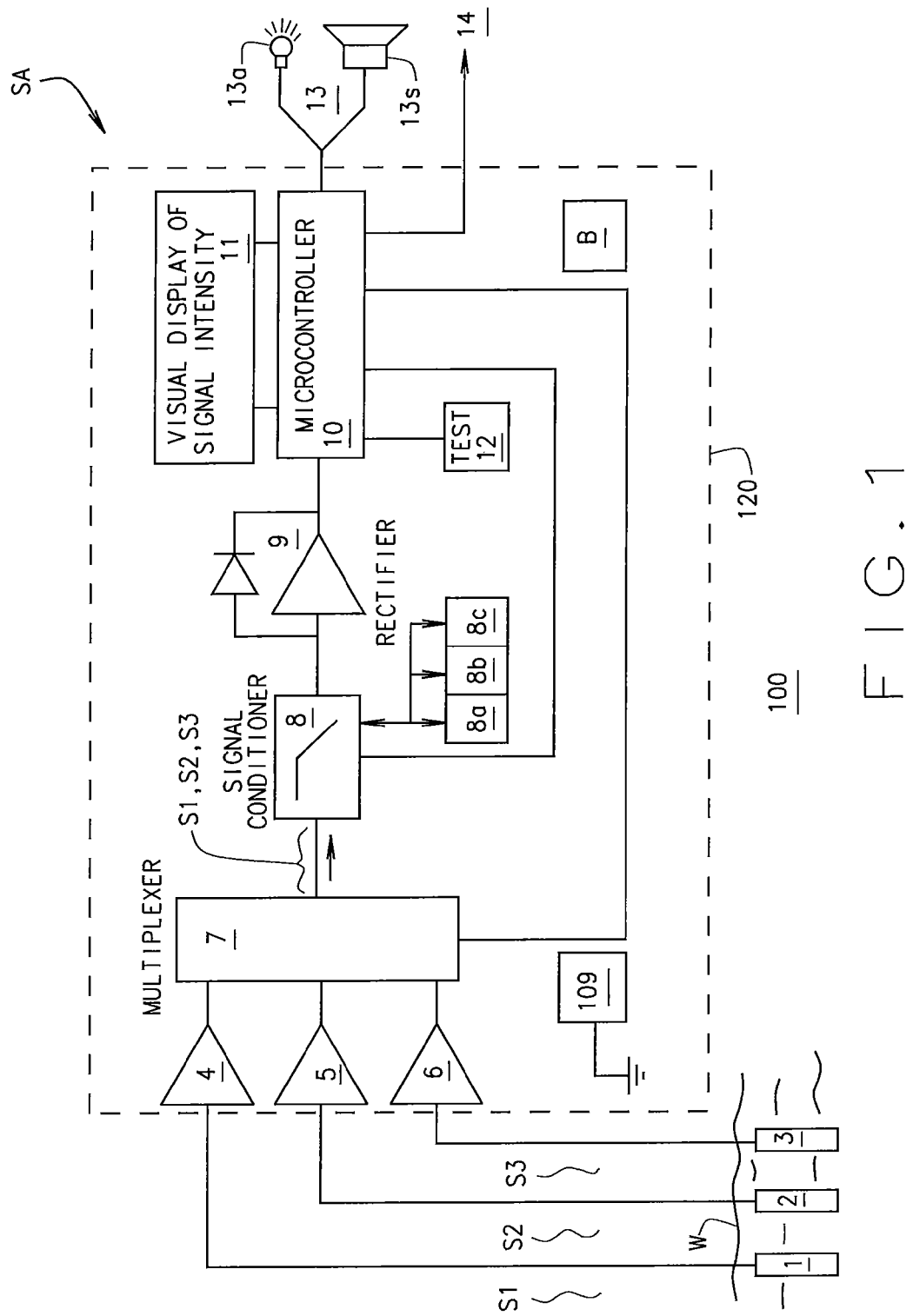
FIG. 1 is a block diagram of sensors and an apparatus of the shock alert warning system of the present invention.

The following detailed description illustrates the invention by way of example and not by way of limitation. This description clearly enables one skilled in the art to make and use the invention, and describes several embodiments, adaptations, variations, alternatives and uses of the invention, including what is presently believed to be the best mode of carrying out the invention. Additionally, it is to be understood that the described system and method is not limited in its application to the details of construction and the arrangement of components set forth in the following description or illustrated in the drawings. The described system and method is capable of other embodiments and of being practiced or carried out in various ways. Also, it will be understood that the phraseology and terminology used herein is for the purpose of description and should not be regarded as limiting.

Figure 2:
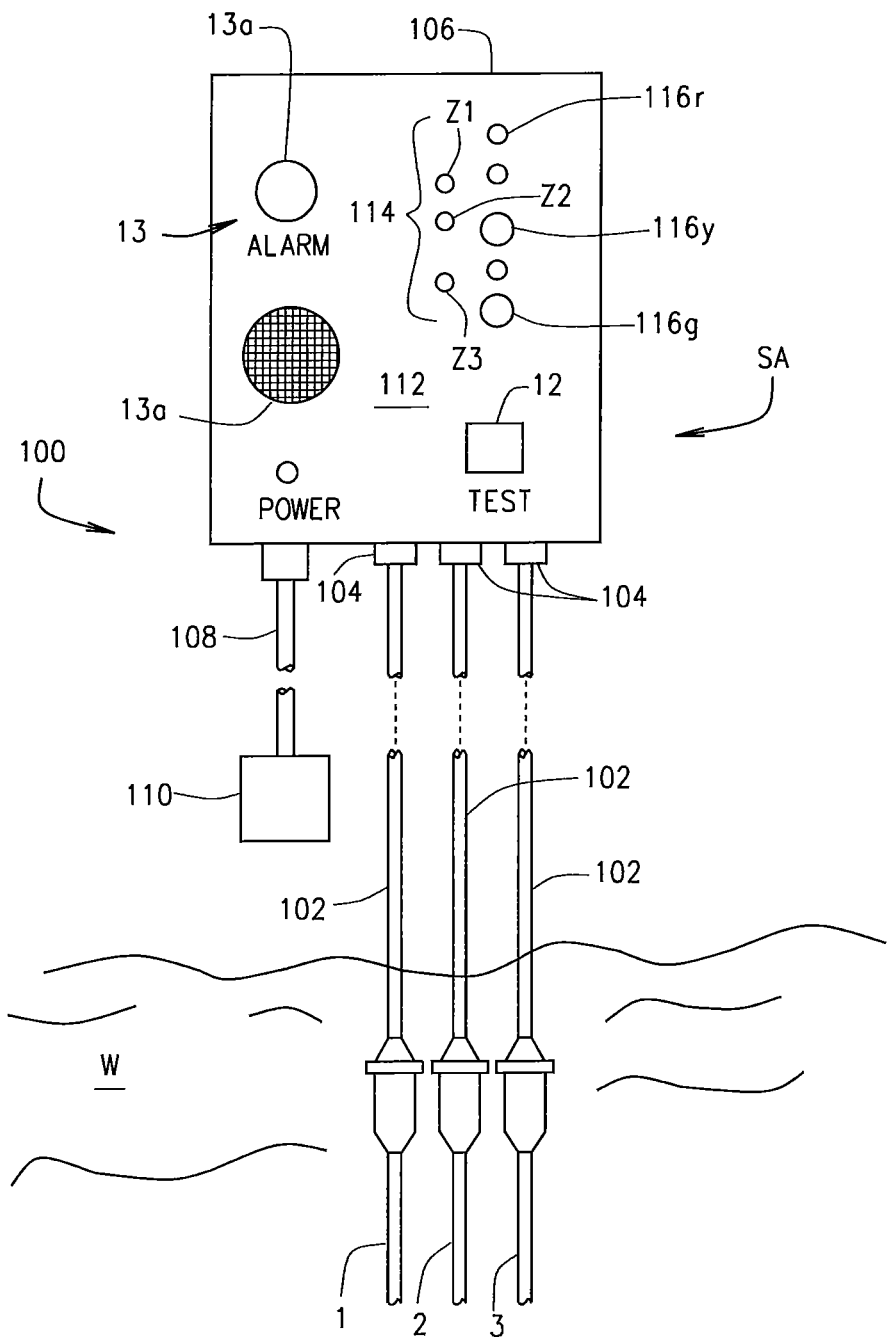
FIG. 2 is a representative view of the sensor and apparatus when installed on, for example, a dock.
Figure 3A:
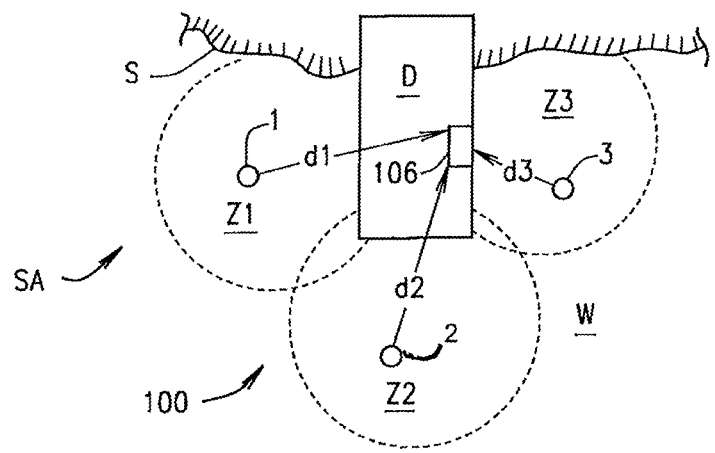
FIG. 3A is a representation of the apparatus installed on a dock and with multiple sensor probes so located as to provide voltage readings within different zones of water about the dock.
Figure 3B:
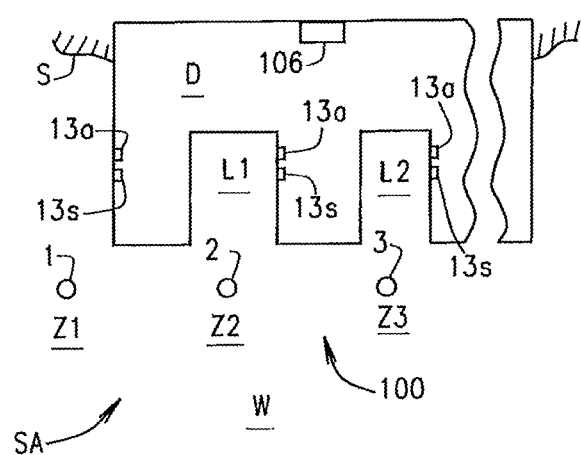
FIG. 3B is a representation of a multi-slip docking facility with multiple sensor probes so located as to provide voltage readings for zones of water associated with each slip; and, FIG. 4 is a block diagram of the system's operation.
Figure 4:
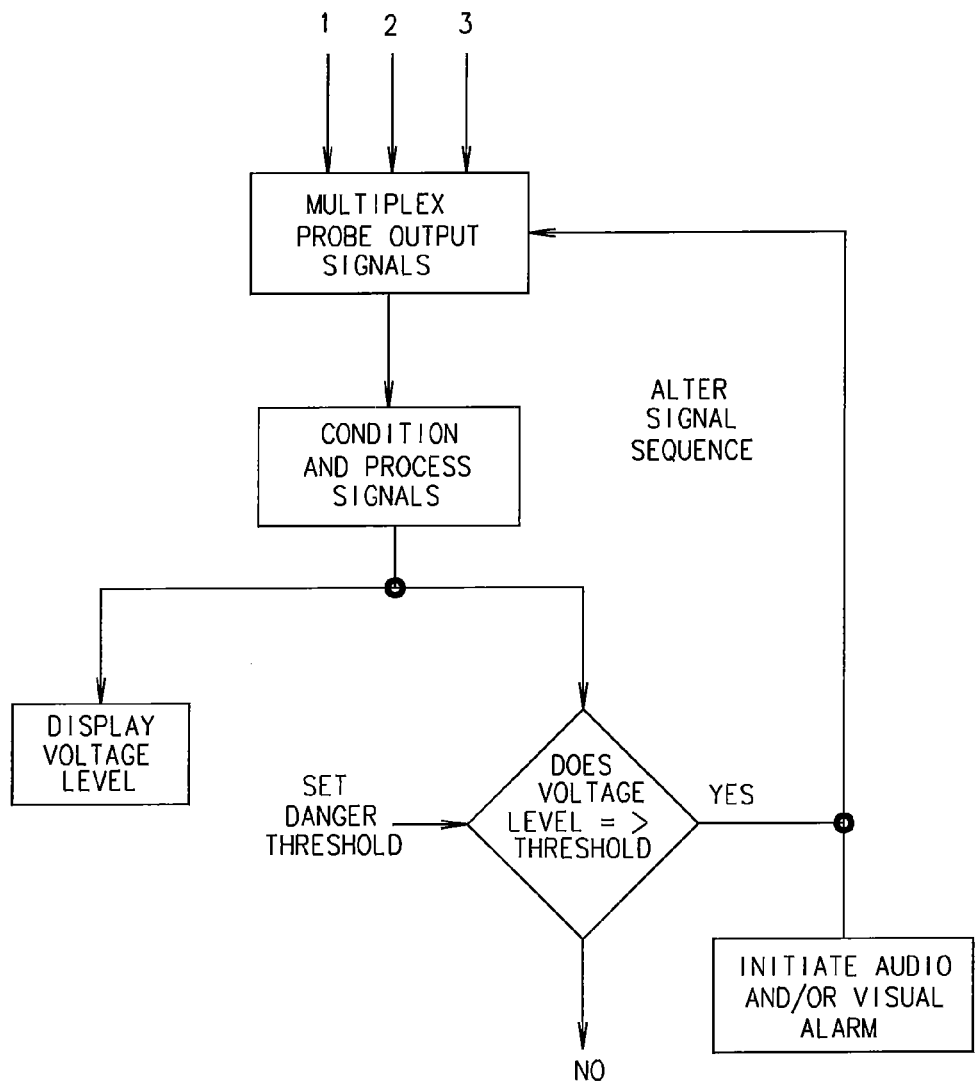

Referring to the drawings, a shock alert system SA of the present invention includes apparatus indicated generally 100. As shown in FIGS. 3A and 3B, apparatus 100 is, for example, installed on a dock D which extends into a body of water W from a shoreline S. Apparatus 100 is used in conjunction with one or more sensor probes of the shock alert system three of which probes designated 1, 2, and 3 are shown in the drawings. Those skilled in the art will appreciate that the system and apparatus can accommodate more than three sensor probes without departing from the scope of the invention. Referring to FIG. 2, each probe 1-3 is separately connected to apparatus 100 by a connecting line 102 which extends between a connector 104 mounted on an enclosure 106 in which components of apparatus 100 are housed, and the respective sensor probe. Those skilled in the art will appreciate that a ground probe is not required for the system to function to detect and warn of dangerous voltage levels; however, a ground probe may be utilized.

Enclosure 106, which is a water resistant enclosure, is installed at a convenient location on dock D and the apparatus is connected to a source of AC power through a power line 108 attached to a plug 110 which is inserted into an electrical outlet preferably located adjacent the enclosure. A voltage transformer 109 is installed within enclosure 106 and the electrical ground for the system is connected to dock D through the transformer housing. For safety purposes, a backup battery B, see FIG. 1, is also installed in enclosure 106.

Once apparatus 100 is in place, each of the probes 1-3 is positioned in a different area of the water adjacent the dock. As shown in FIG. 3A, probe 1 is positioned in an area designated zone Z1, probe 2 in a different area designated zone Z2, and probe 3 in another different area designated zone Z3. As shown in FIG. 3A, there may be a slight overlap between the zones of coverage by the respective probes; although the probes are placed sufficiently far apart that there is generally no overlap between them and they are electrically isolated from, and function independently of, each other so to independently monitor the voltage level in the zone monitored by the probe. Further, each of the probes may be placed a respective distance d1, d2, or d3 from apparatus 100. The distances d1, d2, or d3 may be different from each of the other two distances, and each distance may exceed 40', for example, from apparatus 100.

Referring to FIG. 1, analog electrical signals S1, S2, and S3 from respective sensor probes 1-3, and representing voltages sensed by the respective probes, are transmitted through respective buffer amplifiers 4-6 to convert a high impedance probe signal into a low impedance signal which is supplied to a multiplexer 7. Isolating the probe signals in this manner is important in determining danger zones within the water.

Multiplexer 7 is programmed to sequentially supply the input signals from the respective probes to a signal conditioner 8. Operation of multiplexer 7 is such that signals S sent to signal conditioner 8 are forwarded to the signal conditioner in a predetermined sequence, for example, S1,S2,S3,S1,S2,S3, etc.; although, as discussed hereinafter, this format can be changed as a result of subsequent signal processing. Also, multiplexer 7 is programmable to control the time interval each sensor signal S1-S3 is sequentially transmitted to the signal conditioner.

Signal conditioner 8 is, in effect, a smart filter and operates on each sensor signal supplied to it to structure the signal into a prescribed format for further processing. In this regard, signal conditioner 8 comprises a series of modules which perform operations on the signals supplied to it. These include signal amplification by a module 8a, filtering by a module 8b, and an initial signal processing by a module 8c. These functions are important because research has found that measuring unfiltered and unprocessed absolute voltage readings can result in false readings.

Output signals from signal conditioner 8 are next rectified by a rectifier 9. Rectifier 9 takes each now amplified, filtered, and initially processed signal and converts it to a DC voltage which is supplied as an input to a microcontroller 10 which further processes each now converted DC voltage signal. Microcontroller 10 continuously processes the signals supplied to it to determine the voltage level in each monitored zone of water, compare it to a stored threshold value representing a dangerous condition, and determine if the sensed voltage level is below the threshold for a dangerous condition, if the voltage level is approaching the threshold, or if the voltage has reached or exceeded the threshold and that a dangerous condition exists in that zone of water.

Referring to FIG. 2, a TEST button 12 located on a front panel 112 of enclosure 106 enables a user of the system to program various settings into microcontroller 10. These settings include:

a) an OFFSET VOLTAGE which is programmed into the system to compensate for ground loops and "phantom" voltages;

b) a GAIN value which is an amplification factor that is applied to an input signal to increase the sensitivity of the shock alert warning system SA;

c) an ALARM LEVEL which is a voltage level which, when sensed by the system, causes audio and visual alarms to be activated; and, d) I/O which is a voltage level that triggers an output from the shock alert warning system to a remote location (e.g., the facility owner's house or office, a fire house or a police station, etc.). The output is provided by a warning module in the microcontroller.

Installed on front panel 112 of enclosure 100 is an LED display 114. Display 114 comprises a vertical arrangement of LEDs 116. Preferably, display 114 includes ten (10) LEDs although it may comprise more, or fewer, LED elements. Display 114 provides a visual indication to an observer of the measured voltage levels from sensor probes 1-3.

In this regard, the LEDs may display, for example, one of three colors with a green color LED 116g indicating the measured voltage is within a safe range of measurements, a yellow color LED 116y indicating that a measured voltage has exceeded a normal range of values and may be approaching a danger level, and a red color LED 116r indicating that the measured voltage has reached a danger level. A yellow or red light indication means that precautionary steps (e.g., getting people in the water out of the water or cautioning people near the water to stay out of it) should be taken. For simplicity of observation, the green color LEDs 116g are located at the lower end of display 114, the yellow color LEDs 116y above the green color LEDs, and the red color LEDs 116r at the upper end of the display. Illumination of the LEDs is driven by an output from microcontroller 10. Importantly, by viewing the LEDs in the vertical array of lights, one can immediately tell if the sensed water condition within a zone is approaching that of a dangerous condition. Because of this feature, a shock alert system of the present invention provides a predictive capability since as more of the yellow color LEDs becomes illuminated, it indicates that, for persons' safety they should leave the water, or if out of the water, not enter it.

Display 114 may further include a separate LED arrangement to identify which zone Z1-Z3 of water the vertical array of LEDs 116g, 116y, 116r currently represents.

LED display 114 comprises a portion of a visual display of signal intensity module 11 of apparatus 100. In addition to the visual display, apparatus 100 further includes an alarm 13 which consists of an integrated visual alarm indictor 13a installed on front panel 112 of enclosure 106 and an audio speaker 13s also mounted on the front panel. Visual alarm indicator 13a produces a flashing light when triggered by an output from microcontroller 10; while, at the same time, a siren sound is produced through speaker 13s. In addition, an alarm output signal is provided, as indicated at 14 in FIG. 1, to remote locations such as the dock owner's home or office, fire and police departments and other first responders.

It will be appreciated that alarm 13 may consist of more than one visual alarm indicator 13a and speaker 13s. Thus, as shown in FIG. 3B, a separate audio and visual alarm may be installed for each slip of a multi-boat docking facility to insure that anyone on or near the dock can see or hear an alarm. The audio and visual alarms 13a and 13s on front panel 112 of enclosure 106, and the remote audio and visual alarm indicators remain activated by microcontroller 10 so long as the sensed dangerous condition exists. Once the signals processed by microcontroller 10 indicate that the sensed voltage level in a zone has fallen below the established threshold and that a dangerous condition no longer exists, microcontroller 10 will deactivate the various audio and visual alarms.

Microcontroller 10 includes a memory which is programmable to broadcast a verbal alarm as part of the audio alarm. For example, when a potentially dangerous condition is sensed and alarm 13 is activated, an audio alarm is sounded through the speakers 13s followed by a verbal warning such as "swim away from the dock, electricity in the water." In addition, the memory can also provide a verbal message with the alarm output signal indicated at 14 informing the remote locations as to at which dock, slip, etc. the potentially dangerous condition has been detected.

Those skilled in the art will understand that if a dangerous condition is sensed in two or more of the monitored zones Z1-Z3, microcontroller 10 will not deactivate the audio and visual alarms until the dangerous condition no longer exists in all of those zones.

The buffer amplifiers 4-6, multiplexer 7, signal conditioner 8, rectifier 9, microcontroller 10, and the visual display and signal intensity module 11 are all installed on one or more printed circuit boards (PCBs) collectively indicated 120 in FIG. 1. The PCB(s) is installed in enclosure 106, together with backup battery B.

As previously discussed, operation of multiplexer 7 is such that signals S sent to signal conditioner 8 are forwarded to the signal conditioner in a predetermined sequence, for example, S1,S2,S3,S1,S2,S3, etc. The sequence and length of time each signal S1, S2, and S3 is propagated through multiplexer 7 is controlled by microcontroller 10. When signal processing by the microcontroller indicates a danger threshold of a voltage sensed by a probe 1, 2, or 3 is approaching, has reached, or exceeds a preset threshold voltage, microcontroller 10 will lock onto the signal from the respective probe and display both the zone Z1, Z2, or Z3 and level of the voltage for that zone on display 114.

In this regard, microcontroller 10 can command multiplexer 7 to only accept signals from the probe for the particular zone, to the exclusion of the signals from the other probes. In this instance, the signal sequence changes to, for example, S1,S1,S1, etc. until the voltage level in the zone falls below the threshold. Or, microcontroller 10 may command multiplexer 7 to process signals from the particular probe for that zone for a longer period during each sequence than the signals from the probes for the other zones. In this instance the sequence would become, for example, S1 . . . , S2, S3, S1 . . . , S2, S3. Or, microcontroller 10 may command multiplexer 7 to interleave the signal from the respective probe with those from the other probes. In this instance, the sequence would become, for example, S1,S2, S1,S3,S1,S2,S1,S3 etc.

In each circumstance, emphasis is on "tightly" monitoring the zone where a danger situation exists. If processing the signals from sensor probes 1-3 indicates a danger situation in more than one zone, microcontroller 10 controls multiplexer 7 to provide a variation of the second or third options described above so to closely monitor the situation with respect to both of the zones. If a danger situation exists in all three zones Z1-Z3, then microcontroller 10 commands multiplexer 7 to accept the signals in the same sequence as originally described.

What has been described is a shock alert warning system SA employing multiple sensor probes 1-3 and an associated apparatus 100 for detecting voltage levels in water that approaches or exceeds a danger threshold. The probes are placed in different areas (zones) about a dock to enhance coverage by the system. The apparatus and probes are easily installed and are safe and reliable in operation. The system operates to eliminate false readings and when sensed voltage levels from a particular area indicate a potentially dangerous condition, the system focuses on that area to insure everyone's safety. When a dangerous condition is detected, an audio alarm is sounded and a visual alert is provided, as well as remote locations being informed of the dangerous condition.

In view of the above, it will be seen that the several objects and advantages of the present disclosure have been achieved and other advantageous results have been obtained.

Having thus described the invention, what is claimed and desired to be secured by Letters Patent is:

1. A predictive shock alert warning system installed adjacent a body of water for monitoring a level of voltage present in the water and alerting persons in or near the water, or about to enter the water, to leave the water or not enter the water when a sensed level of voltage approaches, reaches, or exceeds a threshold level representing a dangerous condition which can harm or kill a person, the system comprising:
   a plurality of sensor probes placed in the water, each probe monitoring the level of voltage in a zone of water surrounding the respective probe, each probe producing an output signal representing the level of voltage in the respective zone in which the probe is placed; and,
   an apparatus to which each sensor probe is connected to process respective output signals from each probe, the apparatus including:
      a signal conditioner conditioning the received probe signals for processing by a processor to determine if the level of a sensed voltage has approached, reached, or exceeded the threshold level indicating that a dangerous condition exists;
      a processor processing the conditioned signals to determine if a voltage level represented by a processed signal has approached, reached, or exceeded the threshold voltage level indicative that a dangerous condition exists;
      an alarm triggered by an alarm output from the processor to generate one of an audio alarm, a visual alarm, or both an audio and a visual alarm, to warn persons in an area of water where a dangerous condition exists that the persons should take appropriate action to avoid the dangerous condition and prevent their harm or death; and,
      a multiplexer to which the signals from the respective probes are supplied, the multiplexer transmitting received probe signals to the signal conditioner in a predetermined sequence which is a function of the voltage level represented by each respective signal after the signal has been processed.

2. The system of claim 1 wherein the signals produced by the probes are analog signals continuously supplied to the apparatus, the signal conditioner of the apparatus converting the analog signals to digital signals for processing.

3. The system of claim 1 employing at least three probes to monitor a voltage level in the water and each sensor probe is positioned a distance from the apparatus in a different direction from the apparatus than the other probes with each of the probes operating independently of the other probes.

4. The system of claim 3 in which the distance of at least one of the probes is positioned from the apparatus exceeds at least forty feet (40').

5. The system of claim 1 in which the signal conditioner includes amplification means amplifying each probe signal transmitted through the multiplexer.

6. The system of claim 5 in which the signal conditioner means further includes filtering means filtering each amplified probe signal.

7. The system of claim 6 in which the signal conditioner still further includes signal processing means performing an initial processing of each amplified and filtered probe signal prior to processing of each amplified and filtered probe signal by the processor.

8. The system of claim 1 wherein the processor comprises a microcontroller to which output signals from the probes are supplied from the signal conditioner, the microcontroller processing the signals from the signal conditioner to continuously determine the level of voltage in each monitored zone of water.

9. The system of claim 8 further including a rectifier interposed between an output of the signal conditioner and an input to the microcontroller.

10. The system of claim 8 wherein the apparatus further includes
means for programming microcontroller settings including one or more of: an offset voltage control to compensate for ground loops and phantom voltages;
a gain value representing an amplification factor applied to an input signal from the signal conditioner to increase system sensitivity;
an alarm level comprising a voltage representing the threshold for a dangerous condition and which causes audio and visual alarms to be activated; and,
an input/output module activation which triggers an output from the system to remote monitoring locations that a dangerous condition exists.

11. The system of claim 8 further including a visual display displaying the level of voltage in a zone as sensed by the probe located in that zone.

12. The system of claim 11 in which the visual display is responsive to output signals from the microcontroller to display the level of voltage in a zone, the visual display including a plurality of colored lights with the sensed voltage level being represented by which colored light is illuminated, the illumination of a light of one color indicating the voltage level is below the threshold for a dangerous condition, the illumination of a light of a second color indicating the voltage level is approaching the threshold, and the illumination of a light of a third color indicating the voltage level has reached or exceeded the threshold and that a dangerous condition exists in that zone of water.

13. The system of claim 8 in which the microcontroller supplies an alarm signal to an audio alarm device to activate the audio alarm device, and an alarm signal to visual alarm device to activate the visual alarm device, the audio alarm including a verbal message.

14. The system of claim 13 further including audio and visual alarms located remotely from the apparatus, said remote audio and visual alarms also being activated by outputs from the microcontroller when a dangerous condition exists.

15. The system of claim 14 wherein if a dangerous condition is sensed to exist in two or more of the monitored zones of water, all of the audio and visual alarms remain activated by the microcontroller until all of the sensed dangerous conditions no longer exist in any of the zones.

16. The system of claim 1 wherein the processor comprises a microcontroller to which output signals from the probes are supplied, the microcontroller processing the signals to determine the level of voltage in each monitored zone of water, and the multiplexer being controlled by an output from the microcontroller to the multiplexer to modify the predetermined sequence in which the output signals from the probes are supplied to the signal conditioner if a sensed voltage level represented by the processed signals for a zone is approaching, has reached, or exceeds a preset threshold voltage indicating a dangerous condition exists in a monitored zone.

17. The system of claim 16 in which the microcontroller modifies the predetermined sequence for the multiplexer to one of the following:
transmit signals to the signal conditioner only from the probe sensing the voltage level in the one zone where the dangerous condition is being approached or exists to the exclusion of signals from the other probes; or,
continue to transmit signals from each of the probes to the signal conditioner but transmit signals from the probe sensing the voltage level in the one zone where the dangerous condition is being approached or exists for a longer interval during each sequence of transmission; or,
continue to transmit signals from each of the probes to the signal conditioner but interleave signals from the probe sensing the voltage level in the one zone where the dangerous condition is being approached or exists between the signals from each of the other probes.

18. The system of claim 1 wherein components of the apparatus are installed on one or more printed circuit boards and installed in a weatherproof enclosure located near the body of water being monitored and the apparatus operates on alternating current (AC) power but which further includes a backup battery installed in the weatherproof enclosure for powering the system in the event of an alternating current (AC) power failure.

19. A method of monitoring a level of voltage present in a body of water and predictively alerting persons in or near the water, or about to enter the water, to leave the water or not enter the water when a sensed level of voltage is approaching, reaches or exceeds a preset threshold voltage level representing a dangerous condition which can harm or kill a person, the method including:
placing a plurality of sensor probes in the water, each probe monitoring the level of voltage in a zone of water surrounding the respective probe with each probe producing an output signal representing the level of voltage in the respective zone in which the probe is placed; and,
processing respective output signals from each probe including:
conditioning signals from the probes by a signal conditioner for processing by a processor to determine if the level of a sensed voltage is approaching, or has reached or exceeded the threshold voltage level indicating a dangerous condition exists;
processing the conditioned signals to determine if a voltage level represented by a processed signal is approaching, or has reached or exceeded the preset threshold voltage level indicative that a dangerous condition exists;
triggering one of an audio alarm, a visual alarm, or both an audio and a visual alarm, to warn persons in the area of water where a dangerous condition exists that the persons should take appropriate action to avoid the dangerous condition and prevent their harm or death; and, multiplexing the signals from the respective probes in a predetermined sequence to a signal conditioner which conditions the signals for processing, the predetermined sequence being a function of the voltage level represented by each respective signal after the signal has been processed.

20. The method of claim 19 in which conditioning the signals includes amplifying each multiplexed probe signal, filtering the probe signal, performing an initial processing of each amplified and filtered probe signal prior to processing each amplified and filtered probe signal, and processing the probe signals by a microcontroller to continuously determine the level of voltage in each monitored zone of water.

21. The method of claim 20 further including
programming settings of the microcontroller for one or more of:
an offset voltage to compensate for ground loops and phantom voltages;
a gain value representing an amplification factor applied to an input signal to the microcontroller to increase sensitivity;
an alarm level comprising a voltage representing the threshold for a dangerous condition and which causes audio and visual alarms to be activated; and,
an input/output module activation which triggers an alarm output to remote monitoring locations that a dangerous condition exists.

22. The method of claim 20 further including
displaying on a visual display the level of voltage in a zone as sensed by the probe located in that zone.

23. The method of claim 22 in which the visual display is responsive to output signals from the microcontroller to display the level of voltage in a zone, the visual display including a plurality of colored lights with the sensed voltage level being represented by which colored light is illuminated, the illumination of a light of one color indicating the voltage level is below the threshold for a dangerous condition, the illumination of a light of a second color indicating the voltage level is approaching the threshold, and the illumination of a light of a third color indicating the voltage level has reached or exceeded the threshold and that a dangerous condition exists in that zone of water.

24. The method of claim 19 wherein activating the audio alarms and visual alarms when a dangerous condition exists including activating audio alarm devices and visual alarm devices located near the zone where the dangerous condition exists and audio and visual alarms remote to that location, and the audio alarm transmitted to each audio alarm device including a verbal message.

25. The method of claim 24 wherein if a dangerous condition is sensed to exist in two or more of the monitored zones of water, all of the audio and visual alarms remain activated until all of the sensed dangerous conditions no longer exist in any of the zones.

26. The method of claim 19 wherein multiplexing of the signals from the sensor probes in the predetermined sequence is modified if a sensed voltage level represented by the processed signals for a zone is approaching, has reached, or exceeds the preset threshold voltage indicating a dangerous condition exists in a monitored zone.

27. The method of claim 26 in which the predetermined sequence for multiplexing is modified to one of the following:
transmission of signals only from the probe sensing the voltage level in the one zone where the dangerous condition is being approached or exists to the exclusion of signals from the other probes; or,
continued transmission of signals from each of the probes but with transmission of signals from the probe sensing the voltage level in the one zone where the dangerous condition is being approached or exists for a longer interval during each sequence of transmission; or,
continued transmission of signals from each of the probes but with signals from the probe sensing the voltage level in the one zone where the dangerous condition is being approached or exists between interleaved with signals from each of the other probes.

28. A predictive shock alert warning system installed adjacent a body of water for monitoring a level of voltage present in the water and alerting persons in or near the water, or about to enter the water, to leave the water or not enter the water when a sensed level of voltage approaches, reaches, or exceeds a predetermined alarm threshold level representing a level that is lower than a dangerous condition which can harm or kill a person, the system comprising:
a plurality of sensor probes placed in the water, each probe monitoring the level of voltage in a zone of water surrounding the respective probe, each probe producing an output signal representing the level of voltage in the respective zone in which the probe is placed; and,
an apparatus to which each sensor probe is connected to process respective outlet signals from each probe, the apparatus including:
a multiplexer to which the signals from the respected probes are supplied, the multiplexer transmitting received probe signals to a signal conditioner in a predetermined sequence which is a function of the voltage level represented by each respective signal after the signal has been processed;
the signal conditioner conditioning the received probe signals for processing by a processor to determine if the level of a sensed voltage has approached, reached, or exceeded the predetermined alarm threshold level;
a processor processing the conditioned signals to determine if a voltage level represented by a processed signal has approached, reached, or exceeded the predetermined alarm threshold voltage level indicative that an alarm condition exists; and,
an alarm triggered by an alarm output from the processor to generate one of an audio alarm, a visual alarm, or both an audio and visual alarm, to warn persons in the area of water where an alarm condition exists that the persons should take appropriate action to avoid the body of water where the alarm condition exists to prevent their harm or death.

29. A method of monitoring a level of voltage present in a body of water and predictively alerting persons in or near the water, or about to enter the water, to leave the water or not enter the water when a sensed level of voltage is approaching, reaches or exceeds a predetermined alarm threshold voltage level representing a level that is lower than a dangerous condition which can harm or kill a person, the method including:
placing a plurality of sensor probes in the water, each probe monitoring the level of voltage in a zone of water surrounding the respective probe with each probe producing an output signal representing the level of voltage in the respective zone in which the probe is placed; and,
processing respective output signals from each probe including:
multiplexing the signals from the respective probes in a predetermined sequence to a signal conditioner which conditions the signals for processing, the predetermined sequence being a function of the voltage level represented by each respective signal after the signal has been processed;

conditioning signals from the probes by a signal conditioner for processing by a processor to determine if the level of a sensed voltage is approaching, or has reached or exceeded the predetermined alarm threshold voltage level indicating an alarm condition exists;

processing the conditioned signals to determine if a voltage level represented by a processed signal is approaching, or has reached or exceeded the predetermined alarm threshold voltage level; and triggering one of an audio alarm, a visual alarm, or both an audio and a visual alarm, to warn persons in the area of water where an alarm condition exists that the persons should take appropriate action to avoid the alarm condition and prevent their harm or death.

* * * * *